United States Patent [19]

Torazzina et al.

[11] Patent Number: 5,101,170
[45] Date of Patent: Mar. 31, 1992

[54] HIGH-EFFICIENCY AUDIO AMPLIFIER

[75] Inventors: Aldo Torazzina; Bruno Murari, both of Monza, Italy

[73] Assignee: SGS Thomson Microelectronics S.R.L., Milan, Italy

[21] Appl. No.: 602,106

[22] Filed: Oct. 22, 1990

[30] Foreign Application Priority Data

Oct. 31, 1989 [IT] Italy ................... 22226 A/89

[51] Int. Cl.⁵ ............................................. H03F 1/14
[52] U.S. Cl. ...................................... 330/51; 330/146
[58] Field of Search .................... 330/51, 146, 207 P, 330/289, 298; 381/120

[56] References Cited

U.S. PATENT DOCUMENTS 4,792,766 12/1988 Wieschhoff et al. .............. 330/298

FOREIGN PATENT DOCUMENTS 0022015 1/1981 European Pat. Off. ........... 330/146

Primary Examiner—Steven Mottola
Attorney, Agent, or Firm—Wolf, Greenfield & Sacks

[57] ABSTRACT

A first non-inverting amplifier unit and a second inverting amplifier unit are driven by a single input signal; their outputs are connected across a load, directly and via a series capacitor, respectively. A circuit disables the second amplifier when the input signal is lower than a preset threshold level.

12 Claims, 3 Drawing Sheets

HIGH-EFFICIENCY AUDIO AMPLIFIER

BACKGROUND OF THE INVENTION

This invention relates to a high-efficiency audio amplifier circuit with switching of the operating state depending on the input signal.

The so-called bridge configuration is usually used for audio amplification in radio sets for motor vehicles and requires two power amplifiers driving the load with two signals in opposite phase; the amplifiers are normally of class AB. With this configuration the high powers required by the market can be obtained, typically 20 W on a 4-ohm load, with a 14.4 V power supply.

The efficiency curve of this type of amplifier has a logarithmic shape, starting from 0% at null power and reaching 70% at maximum output power. Typical power and efficiency curves for this configuration are illustrated in FIG. 1, which is a plot of the dissipated power $P_d$ and of the efficiency against the output power $P_o$. Since the average value of the input signal is 20-30% of the maximum deliverable power (4.6 W for a maximum power of 20 W), as shown by statistical research on the behavior of the musical signal which normally drives these amplifiers, it follows that the average efficiency of the amplifier is in the range 0% to 30%.

FIG. 2, on the other hand, is a similar plot concerning one single-ended amplifier driving the load via a series capacitor, with power supply and load as above.

In order to obtain higher efficiencies and therefore lower dissipation for the same power delivered, it is known to use class D switch amplifiers instead of said class AB amplifiers, or to use devices which modulate the power supply of class AB amplifiers depending on the amplitude of the output signal. Both these prior approaches, however, have severe disadvantages, such as a high degree of complexity or undesirable radiation effects, and furthermore require special power supplies.

SUMMARY OF THE INVENTION

The main object of the invention is therefore to provide an amplifier having a greater operating efficiency at low and medium output powers.

Another object of the invnetion is so to structure the above amplifier that it can be integrated monolithically.

The invention achieves the above object, as well as other objects and advantages as will become apparent from the following disclosure, with an audio amplifier circuit comprising a first, non-inverting amplifier unit, and a second, inverting amplifier unit, which are driven by a single input signal, their outputs being connected across a load, respectively directly and via a series capacitor, characterized in that it furthermore comprises circuit means for disabling the second amplifier when the input signal is lower than a preset threshold level.

BRIEF DESCRIPTION OF THE DRAWINGS

The invention will now be described in greater detail with reference to several preferred embodiments, shown in the accompanying drawings and given only by way of nonlimitative example, wherein.

DESCRIPTION OF THE PREFERRED EMBODIMENTS

Figure 3:
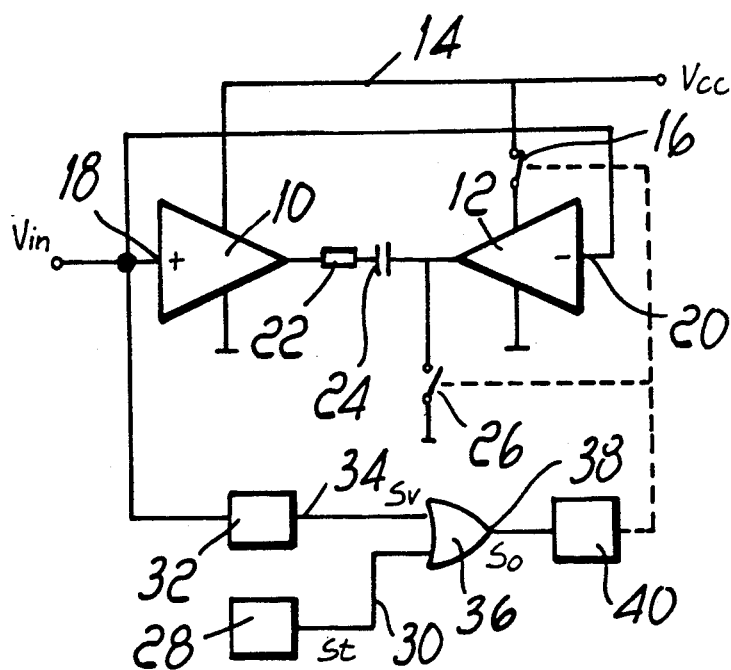
FIG. 3 is a basic circuit diagram of a bridge configuration according to the invention.

With reference to FIG. 3, two class AB amplifiers 10 and 12, non-inverting and inverting, respectively, are powered by a voltage $V_{cc}$ through a line 14 and a first electronic switch 16, respectively. Amplifier 10 receives an input signal $V_{in}$ at its input 18 and amplifies it without inverting it, whereas amplifier 12 receives the same signal $V_{in}$ at its input 20 and amplifies it with inversion. A load 22 is connected with one of its ends directly to the output of amplifier 10 and with its opposite end to the opposite-phase output of amplifier 12 through a series capacitor 24. The node between capacitor 24 and the output of amplifier 12 is connected to ground through a second electronic switch 26.

A temperature sensor 28 senses the operating temperature of the two amplifiers 10 and 12 and provides on its output 30 a logic signal $S_t$ which assumes a value 0 for temperatures increasing up to a first threshold T1, and a value 1 for temperatures higher than T1 and decreasing down to a second threshold T2, which is lower than T1, a hysteresis cycle being thereby generated.

A voltage level sensor 32 is arranged for sensing the level of signal $V_{in}$ and generating on its output 34 a logic signal $S_v$ taking a value 1 when $V_{in}$ is lower than a threshold $V_s$ and a value 0 when $V_{in}$ is higher than said threshold.

Outputs 30 and 34 are applied to the two inputs of an OR gate 36, whose output 38 therefore delivers a logic signal $S_o$ which is the OR combination of the two signals $S_t$ and $S_v$. Signal $S_o$ controls an actuator 40 for opening the switch 16 and closing the switch 26 when $S_o=1$, and for switching the two switches oppositely when $S_o=0$. When input signal $V_{in}$ is higher than the threshold $V_s$ (and assuming, for the time being, that the temperature is such as to not activate sensor 28), the circuit operates in the conditions shown in FIG. 3, with switch 16 closed and switch 26 open. The two amplifiers are therefore connected in a conventional bridge configuration, including its associated power dissipation. However, when input signal $V_{in}$ drops below the threshold $V_s$, the actuator opens switch 16 and closes switch 26, so that amplifier 12 ceases to operate and to absorb power from the power supply, and capacitor 24 is connected to the ground. Only amplifier 10 stays on, and operates in single-ended configuration, with an associated reduction of the power dissipated.

Figure 4:
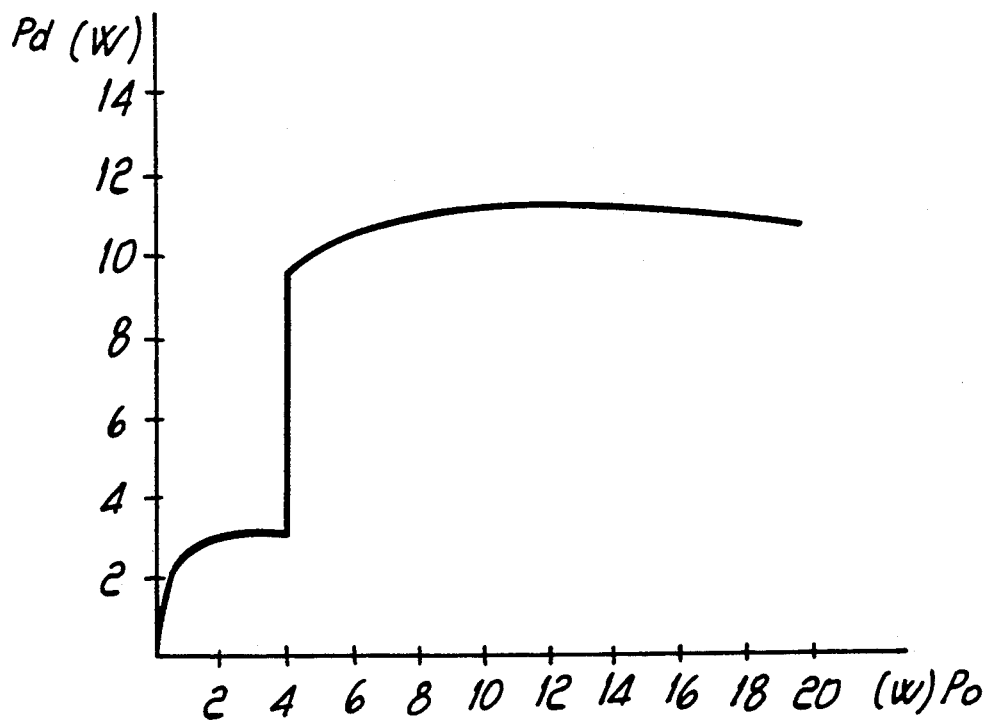
FIG. 4 is a characteristic operating graph of the circuit of FIG. 3.
Figure 5:
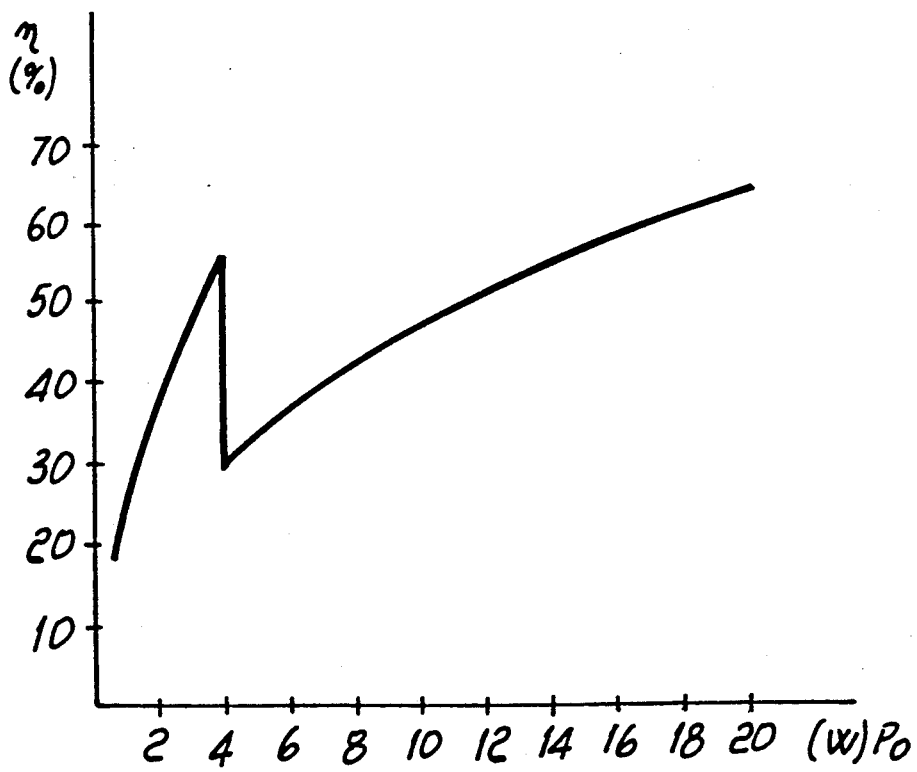
FIG. 5 is another characteristic operating graph of the circuit of FIG. 3.

The results are shown in FIG. 4, which is a plot of the dissipated power $P_d$ against the power $P_o$ delivered to the load for the overall circuit of FIG. 3. FIG. 5 shows, again with respect to the power $P_o$ delivered to the load, the efficiency $\eta$, which has two peaks around 70%: the first one is related to the operation of amplifier 10 alone, the second one is related to the operation of both amplifiers 10 and 12. A better efficiency is therfore obtained from the circuit in the operating region with low output power, which is the prevalent operating condition when performing with a musical signal.

If temperature sensor 28 is now considered as well, inspection of the circuit clearly shows that the circuit responds to a high temperature by only allowing single-ended operation, thereby limiting the dissipated power.

Figure 6:
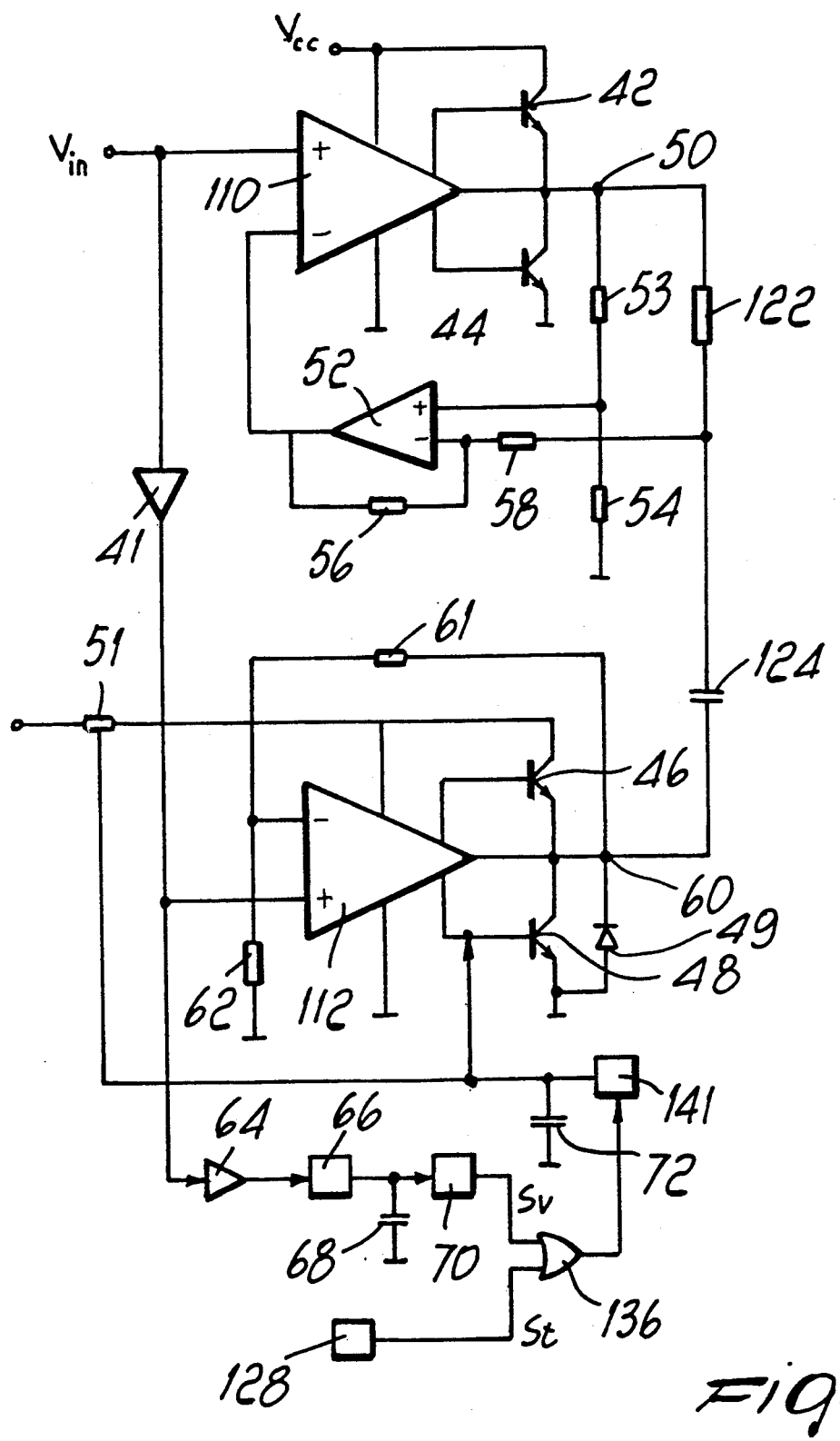
FIG. 6 is a detailed circuit diagram of a bridge configuration according to the invention.

FIG. 6 is a more detailed diagram of a practical embodiment of the circuit according to the invention. The same reference numerals as FIG. 3, increased by 100, have been used for the identical components.

Figure 1:
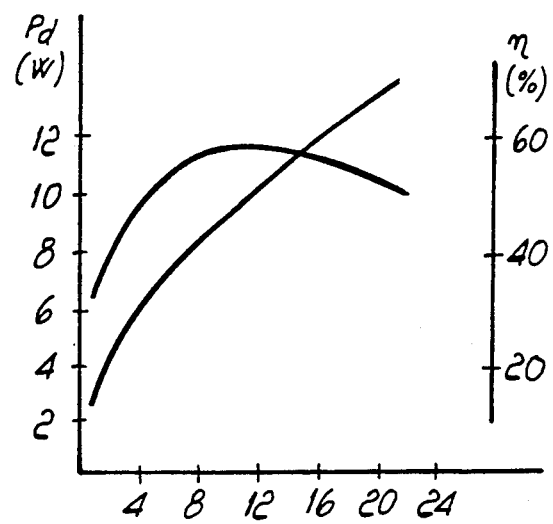
FIG. 1 is a characteristic operation graph of a circuit in the bridge configuration according to the prior art.
Figure 2:
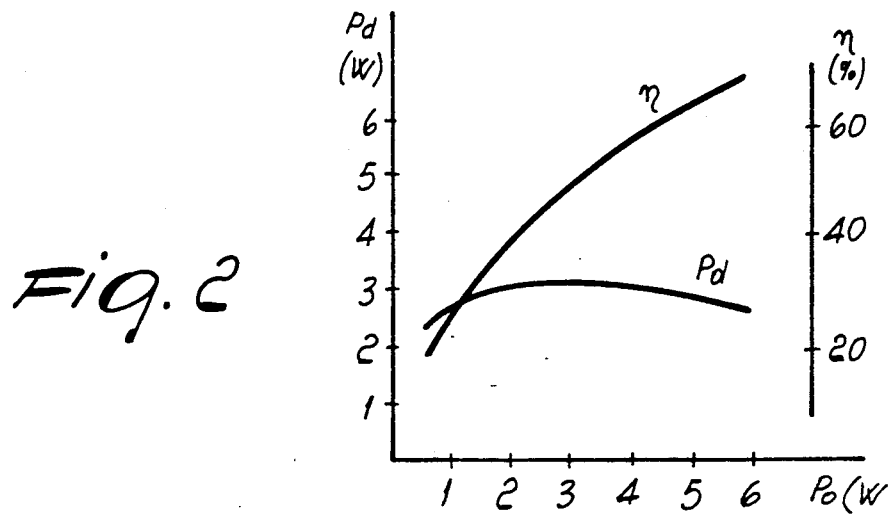
FIG. 2 is a characteristic operating graph, similar to that of FIG. 1, for a single-ended amplifier circuit according to the prior art.

The circuit of FIG. 6 comprises two differential amplifiers 110 and 112 driving a load 122 and a series capacitor 124. Input signal $V_{in}$ is applied directly to the positive input of amplifier 110, but is inverted in an inverter 41 before it is applied to the positive input of amplifier 112. The outputs of the two amplifiers 110 and 112 drive the load, as in FIG. 1, through respective push-pull stages which comprise pairs of NPN transistors 42, 44 and 46, 48. A diode 49 is arranged in parallel to the latter transistor. The power supply of the amplifier furthermore comprises an electronic switch 51 connected in series.

Amplifier 110 is regulated by a feedback unit comprising an operational amplifier 52 with a voltage divider formed by resistors 53, 54 on an output node 50, and with a feedback resistor 56 and a limiting resistor 58, in order to lead the signal existing across load 22 back to the negative input. Amplifier 112 is similarly regulated by resistors 61, 62 which lead the signal existing on output node 60 to its negative input.

The inverted input signal $V_{in}$ is also applied to an amplifier 64, the output whereof is rectified by a rectifier 66 and smoothed out by a capacitor 68 in order to provide an average signal to a threshold circuit 70, the output whereof is the logic signal $S_v$ described with reference to FIG. 3. A temperature sensor 128 similar to the one of FIG. 3 provides a logic signal $S_t$, and both signals $S_v$ and $S_t$ are combined in an OR gate 136 to produce a global logic signal $S_o$. Signal $S_o$ is applied to an actuator 141 consisting in a bistable device which on one hand drives transistor 48 and, on the other hand, controls the opening and closure of electronic switch 51 on the power supply of amplifier 112, similarly to what is described for FIG. 3. A capacitor 72 is connected in parallel to the ground at the output of actuator 140 in order to smooth out the transition steps between one condition of the actuator and the other, avoiding sudden transients on the load (so-called "pop noise").

When signal $S_o$ is 1, electronic switch 51 is open, amplifier 112 is off and transistor 48 conducts stably. When signal $S_o$ drops to 0, switch 51 closes, amplifier 112 switches on and transistor 48 is left free to follow normal push-pull operation. During single-ended operation, the signal current on load 122 flows out of the node at the output of amplifier 112 and flows into the ground node during the positive half-wave of $V_{in}$, whereas it flows out of the ground node and flows into said node during the negative half-wave of $V_{in}$. Transistor 48 and diode 49 are then alternately affected by conduction in the two half-periods. In consideration of the above, the overall operation of the circuit of FIG. 6 is similar to that of FIG. 3.

In order to avoid distortions in the amplification and to keep the gain constant in all operation conditions, the activity of the feedback unit on differential amplifier 110 is essential, as explained hereinafter.

If the resistances of the resistors 53, 54, 56, 58, 61 and 62 are denoted by $R_1$, $R_2$, $R_3$, $R_4$, $R_5$ and $R_6$, and analyzing the circuit in single-ended operation, signal $V_2$ on node 60 is zero, while signal $V_1$ on node 50 is:

$$V_1 = - V_{in} \cdot \frac{R_4}{R_3 + R_4} \cdot \frac{R_1 + R_2}{R_2}$$

However, in real conditions $V_2$ is not exactly zero but rather has a residual value which is linked to the conductions of transistor 48 and of diode 49; this value, if not corrected, creates distortion. The correction is obtained by imposing a unit ratio between $V_1$ and $V_2$, i.e. $V_1/V_2 = 1$. From the above defined relation, it is therefore apparent that the following relation must hold:

$$\frac{R_4}{R_3 + R_4} \cdot \frac{R_1 + R_2}{R_2} = 1 \qquad (1)$$

In the bridge configuration, signal $V_2$ is given by:

$$V_2 = - V_{in} \cdot \frac{R_5 + R_6}{R_6}.$$

The difference of signal $V_2$ from $V_1$ is the useful signal on the load. In order to have the maximum range for both outputs in the bridge operating condition, the gain of 112 should be half the gain of 110, i.e.

$$\frac{R_4}{R_3 + R_4} \cdot \frac{R_1 + R_2}{R_2} \cdot + = \frac{R_5 + R_6}{R_6} \qquad (2)$$

Relations (1) and (2) must therefore be satisfied in order to have minimum distortion with maximum signal range. For instance, in a practical implementation, with a 20 dB gain, the following values have been used: $R_1 = R_4 = 10$ kOhm, $R_5 = 4$ kOhm, $R_2 = R_3 = R_6 = 1$ kOhm.

While preferred embodiments of the invention have been described, it is understood that the man skilled in the field can easily devise other changes and variations within the scope of the inventive concept.

What is claimed:

1. An audio amplifier circuit comprising a first, non-inverting amplifier unit, and a second, inverting amplifier unit, which are driven by a single input signal, the second amplifier unit receiving as an input a signal indicative of said input signal and devoid of means for receiving the output of the first amplifier as an input, their outputs being connected across a load, directly and via a series capacitor, respectively, and circuit means for disabling the second amplifier when the input signal is lower than a preset threshold level.

2. An audio amplifier circuit comprising a first, non-inverting amplifier unit, and a second, inverting amplifier unit, which are driven by a single input signal, their outputs being connected across a load, directly and via a series capacitor, respectively, and circuit means for disabling the second amplifier when the input signal is lower than a preset threshold level, wherein said circuit means for disabling the second amplifier comprises a first electronic switch in the power supply line of the second amplifier, a second electronic switch between the output of the second amplifier and ground, and means sensitive to the voltage level of the input signal and controlling said electronic switches so as to close the first switch and open the second switch when the input signal level is higher than said preset threshold and so as to open the first switch and close the second switch when the input signal level is lower than said preset threshold.

3. The audio amplifier circuit of claim 2, wherein said means sensitive to the input signal voltage level comprises a threshold device connected to the input node of said first amplifier, and having an output controlling an actuator device for said electronic switches.

4. The audio amplifier circuit of claim 2, wherein said means sensitive to the input signal voltage level comprises a threshold device connected to the input node of said first amplifier, and having an output controlling an actuator device for said electronic switches, said actuator device being also controlled in logic alternative by a temperature sensor which is sensitive to the temperature of the first amplifier and of the second amplifier.

5. The audio amplifier circuit of claim 2, wherein said means sensitive to the input signal voltage level comprises a threshold device connected to the input node of said first amplifier, and having an output controlling an actuator device for said electronic switches, said actuator device being a bistable device.

6. The audio amplifier circuit of claim 2, wherein said means sensitive to the input signal voltage level comprises a threshold device connected to the input node of said first amplifier, and having an output controlling an actuator device for said electronic switches, said actuator device being a bistable device, the output of said bistable device being connected to ground through a smoothing capacitor.

7. An audio amplifier circuit comprising a first, non-inverting amplifier unit, and a second, inverting amplifier unit, which are driven by a single input signal, their outputs being connected across a load, directly and via a series capacitor, respectively, and circuit means for disabling the second amplifier when the input signal is lower than a preset threshold level, wherein:

said first amplifier comprises a first operational amplifier having a non-inverting input, an inverting input and an output, and adapted to receive the input signal on the non-inverting input, and a first feedback unit driven by the signal across the load and driving the inverting input of the first operational amplifier; and said second operational amplifier comprises a second operational amplifier having a non-inverting input, an inverting input, an output, an inverter connected to the non-inverting input of the second operational amplifier and driving its inverting input.

8. The audio amplifier circuit of claim 7, wherein said first feedback unit comprises a third operational amplifier having a non-inverting input and an inverting input, a resistive voltage divider connected between one end of the load and the ground and having a central node connected to the non-inverting input of the third operational amplifier, a limiting resistor connected between the other end of the load and the non-inverting input of the third operational amplifier, and a feedback resistor connected between the non-inverting input of the third operational amplifier and its output.

9. The audio amplifier circuit of claim 7, wherein said first feedback unit comprises a third operational amplifier having a non-inverting input and an inverting input, a resistive voltage divider connected between one end of the load and the ground and having a central node connected to the non-inverting input of the third operational amplifier, a limiting resistor connected between the other end of the load and the non-inverting input of the third operational amplifier, and a feedback resistor connected between the non-inverting input of the third operational amplifier and its output; the resistances $R_1$, $R_2$ of the resistive voltage divider, the resistance $R_3$ of the feedback resistor and the resistance $R_4$ of the limiting resistor of the first feedback unit being linked by the relation:

$$\frac{R_4}{R_3 + R_4} \cdot \frac{R_1 + R_2}{R_2} = 1$$

10. The audio amplifier circuit of claim 7, wherein said first feedback unit comprises a third operational amplifier having a non-inverting input and an inverting input, a resistive voltage divider connected between one end of the load and the ground and having a central node connected to the non-inverting input of the third operational amplifier, a limiting resistor connected between the other end of the load and the non-inverting input of the third operational amplifier, and a feedback resistor connected between the non-inverting input of the third operational amplifier and its output; the resistances $R_1$, $R_2$ of the resistive voltage divider, the resistance $R_3$ of the feedback resistor and the resistance $R_4$ of the limiting resistor of the first feedback unit being linked by the relation:

$$\frac{R_4}{R_3 + R_4} \cdot \frac{R_1 + R_2}{R_2} = 1$$

said resistances of the first amplifier, the resistance $R_5$ of the feedback resistor of the second feedback unit and the resistance $R_6$ of the limiting resistor of the second feedback unit being linked by the relation:

$$\frac{R_4}{R_3 + R_4} \cdot \frac{R_1 + R_2}{R_2} \cdot + = \frac{R_5 + R_6}{R_6}$$

11. The audio amplifier circuit of claim 7, wherein the outputs of said first and second operational amplifiers drive the ends of the load across respective push-pull stages.

12. The audio amplifier circuit of claim 1, wherein said circuit means for disabling the second amplifier unit turns off the second amplifier unit when the input signal is lower than a preset threshold level.

* * * * *